(12) United States Patent
Kobayashi

(10) Patent No.: US 6,768,648 B2
(45) Date of Patent: Jul. 27, 2004

(54) SHEET AND ELECTRONIC APPARATUS USING THE SHEET

(75) Inventor: Hironobu Kobayashi, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/454,528

(22) Filed: Jun. 5, 2003

(65) Prior Publication Data

US 2003/0230616 A1 Dec. 18, 2003

(30) Foreign Application Priority Data

Jun. 14, 2002 (JP) .................................. P2002-173678

(51) Int. Cl.$^7$ .............................................. H05K 7/14
(52) U.S. Cl. ................................ 361/758; 174/138 E
(58) Field of Search ............................ 361/758, 812; 174/138 E, 138 D, 138 G, 137 R, 166 S

(56) References Cited

U.S. PATENT DOCUMENTS

| | | | | |
|---|---|---|---|---|
| 3,575,120 A | * | 4/1971 | Paulson et al. ............. | 112/136 |
| 4,004,199 A | * | 1/1977 | Pearce et al. ............... | 361/521 |
| 4,227,668 A | * | 10/1980 | Ernst .......................... | 248/317 |
| 5,024,402 A | * | 6/1991 | Hamel ......................... | 248/52 |
| 5,342,995 A | * | 8/1994 | Comerci et al. ............. | 174/67 |
| 5,691,504 A | * | 11/1997 | Sands et al. ............... | 174/35 R |
| 5,732,445 A | * | 3/1998 | Stodolka et al. ............ | 24/16 R |
| 5,796,593 A | * | 8/1998 | Mills et al. ................. | 361/801 |
| 5,951,307 A | * | 9/1999 | Klein et al. .................. | 439/92 |
| 6,061,249 A | * | 5/2000 | Nealis ......................... | 361/785 |

* cited by examiner

*Primary Examiner*—Neil Abrams
(74) *Attorney, Agent, or Firm*—Sughrue Mion, PLLC

(57) ABSTRACT

A coupling unit for attaching an electric wiring substrate to a cabinet of an electronic apparatus is passed through a slit provided in a sheet and the sheet is fixed. At this time, the coupling unit is grasped by restoring force of the sheet since a width of the slit is smaller than a thickness of the coupling unit. Incidentally, when both sides of the slit are curled up by the coupling unit, force by which the slit is further caused to be ruptured acts, but rupture can be prevented by rupture stop portions provided in both ends of the slit.

3 Claims, 8 Drawing Sheets

SHEET AND ELECTRONIC APPARATUS USING THE SHEET

CROSS REFERENCE OF RELATED APPLICATION

This application is based on and claims priority with respect to Japanese Patent Application No. 2002-173678 filed on Jun. 14, 2002, the entire content of which is incorporated herein by reference.

BACKGROUND OF THE INVENTION

1. Field of the Invention

This invention relates to a sheet and an electronic apparatus using this sheet, and to a sheet and an electronic apparatus using this sheet capable of easily attaching and fixing a sheet to a base of an electronic apparatus and also easily separating and recycling the sheet at the time of scrap.

2. Description of the Related Art

Conventionally, in the case of fixing a substrate 52 for electric wiring to a cabinet 51 such as a frame or a body of an electronic apparatus 50, a pawl-shaped cut raised portion 53 which is a coupling unit provided in the cabinet 51 is used as shown in FIG. 11. That is, the cut raised portion 53 is provided with a step 54 for placing the substrate 52 and a twist portion 55 for fixing the substrate 52.

On the other hand, the substrate 52 is provided with a rectangular notch 56 which passes through the twist portion 55 of the cut raised portion 53 and also is placed on the step 54.

Therefore, the twist portion 55 of the cut raised portion 53 is inserted into the notch 56 of the substrate 52 and the substrate 52 is placed on the step 54 of the cut raised portion 53 and as shown in FIG. 12, the twist portion 55 upward protruding from the substrate 52 is twisted about 45° to 90° and the twist portion 55 is protruded from the notch 56 of the substrate 52 and the substrate 52 is fixed on the cut raised portion 53.

On the other hand, as shown in FIGS. 11 and 12, a sheet 57 made of paper, PET, resin, fiber, etc. for electrically isolating both of the cabinet 51 and the substrate 52 or insulating heat or magnetism according to the purpose is attached between the cabinet 51 and the substrate 52.

This sheet 57 is fixed to the cabinet 51 using the cut raised portion 53 provided for fixing the substrate 52 to the cabinet 51. For this purpose, for example, a slit 58 cut in I shape (see FIG. 14) is provided in a predetermined position of the sheet 57.

Therefore, in the case of attaching the sheet 57 to the cabinet 51, as described above, before the substrate 52 is attached to the cabinet 51, the cut raised portion 53 is passed from the lower portion to the upper portion of the slit 58 as shown in FIGS. 11 and 12.

As a result of this, as shown in FIG. 13, the cut raised portion 53 is sandwiched by restoring force of both side portions 58a of the slit 58 bent and raised by the cut raised portion 53 and the sheet 57 is fixed. Or, as shown in FIG. 12, the sheet 57 is fixed by further using adhesive means 59 such as two-sided tape or glue between the sheet 57 and the cabinet 51.

However, when the slit 58 is provided and the sheet 57 is fixed to the cut raised portion 53, in case that force acts on the sheet 57 and the sheet 57 is pulled, rupture 60 occurs from the ends 58b of the slit 58 as shown in FIG. 14.

Because of this, in comparison with a state before the rupture 60 occurs as shown in FIG. 15(A), after the rupture 60 occurs as shown in FIG. 15(B), there is a problem that restoring force for pushing both the side portions 58a of the slit 58 to the cut raised portion 53 becomes weak and the sheet 57 cannot be fixed to the cut raised portion 53.

Also, when vibration is applied to the cabinet 51, there is a problem that the sheet 57 flutters in both sides of the slit 58.

Further, when the sheet 57 is fixed to the cut raised portion 53 by the slit 58 and also the sheet 57 is directly attached to the cabinet 51 using adhesive means 59 such as tape or glue, there is a problem that material of the adhesive means 59 costs and an increase in cost is caused.

Also, there is a problem that it takes time and effort to peel the sheet 57 off the cabinet 51 at the time of scrap and is troublesome and also separability is wrong and it is unsuitable for recycling.

SUMMARY OF THE INVENTION

The invention is implemented in view of the problems described above, and an object of the invention is to provide a sheet which can surely be fixed to a base without using adhesive such as tape or glue and is excellent in separability at the time of scrap, and an electronic apparatus using this sheet.

In order to achieve the object, according to one aspect of the invention, there is provided a sheet which is attached to a coupling unit raised from a base and is placed on the base, the sheet comprising:

a slit portion through which the coupling unit passes is had, a width of the slit portion being formed smaller than a thickness of the coupling unit; and rupture stops formed at both ends of the slit.

In this specification, paper, PET, resin, fiber, etc. are given as material of the sheet, but it is not limited to these as long as it is the material for performing insulation between a base and an electric wiring substrate.

Incidentally, the insulation means insulation required according to the nature of an electronic apparatus, for example, electrical insulation, heat insulation or magnetic insulation. Further, a sheet with high elasticity is preferably used as the sheet. Also, as a coupling unit, a cut raised portion in which a part of a cabinet is cut and is bent to the side to which the substrate is attached can be considered.

In the sheet constructed thus, a coupling unit for attaching an electric wiring substrate to a cabinet of an electronic apparatus is passed through a slit provided in the sheet. A width of the slit is smaller than a thickness of the coupling unit, so that the sheet is curled up in both sides of the slit by the coupling unit.

Because of this, the sheet tends to return to a flat state and grasps the coupling unit by this restoring force. As a result of this, the sheet is fixed to the coupling unit.

Incidentally, when both sides of the slit are curled up by the coupling unit, force by which the slit is further caused to be ruptured acts, but rupture can be prevented by rupture stops provided in both ends of the slit.

As a result of this, the sheet can surely be fixed to the coupling unit.

According to another aspect of the invention, the rupture stop is an opening formed in a shape without a stress concentration portion or a rupture stop slit inclined to a rupture direction acting on the slit end.

Here, openings with circle or ellipse are given as the opening without a stress concentration portion. In addition, it may be an opening in which the whole shape is rectangular shape and corner portions are rounded.

Also, the rupture stop slit inclined to a rupture direction acting on the slit end means a rupture stop slit inclined to a slit orthogonal direction which is a rupture direction.

Therefore, a rupture stop slit provided straight and slantingly in the slit end, a rupture stop slit provided in Y shape forked from the slit end, etc. correspond.

Incidentally, one end of a slit may be formed in a circular opening and the other end may be formed in a Y-shaped rupture stop slit.

The sheet constructed thus attempts to widen the slit end when the coupling unit passes through the slit, but rupture of the slit is prevented by the opening or the rupture stop slit inclined to the rupture direction, so that the sheet in which both sides of the slit curl up grasps the coupling unit and the sheet can be fixed.

According to another aspect of the invention, a hold sheet which has the same material as that of the sheet and has a through sheet passed through the coupling unit is placed with the hold sheet overlaid on a range including the slit and the vicinity of its slit.

In the sheet constructed thus, a hold sheet in which a slit similar to that of the sheet is provided is overlaid on the sheet to grasp the coupling unit, so that the sheet can be fixed surely.

Also, the hold sheet having the same material as that of the sheet is used, so that separation at the time of scrap is easy.

According to another aspect of the invention, there is provided an electronic apparatus which has a base and attaches an electric wiring substrate by a coupling unit raised from this base and provides a sheet placed between the base and the electric wiring substrate, wherein the sheet has a slit in which a width is formed smaller than a thickness of the coupling unit and rupture stops are formed in both ends, and the slit is passed through the coupling unit so as to be raised from the base.

In the specification, paper, PET, resin, fiber, etc. are given as material of the sheet, but it is not limited to these as long as it is the material for performing insulation between a base and an electric wiring substrate.

Incidentally, the insulation means insulation required according to the nature of an electronic apparatus, for example, electrical insulation, heat insulation or magnetic insulation. Also, a sheet with high elasticity is preferably used as the sheet. Also, as a coupling unit, a cut raised portion in which a part of a cabinet is cut and is bent and raised to the side to which the substrate is attached can be considered.

In the electronic apparatus constructed thus, a coupling unit for attaching an electric wiring substrate to a cabinet of the electronic apparatus is passed through a slit provided in a sheet. A width of the slit is smaller than a thickness of the coupling unit, so that the sheet is curled up in both sides of the slit by the coupling unit.

Because of this, the sheet tends to return to a flat state and thereby grasps the coupling unit by this restoring force. As a result of this, the sheet is fixed to the coupling unit.

Incidentally, when both sides of the slit are curled up by the coupling unit, force by which the slit is further caused to be ruptured acts, but rupture can be prevented by rupture stop portions provided in both ends of the slit. As a result of this, the sheet can surely be fixed to the coupling unit.

According to another object of the invention, there is provided electronic apparatus having a protrusion being capable of engaging the slit at the side of the coupling unit.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Figure 1:
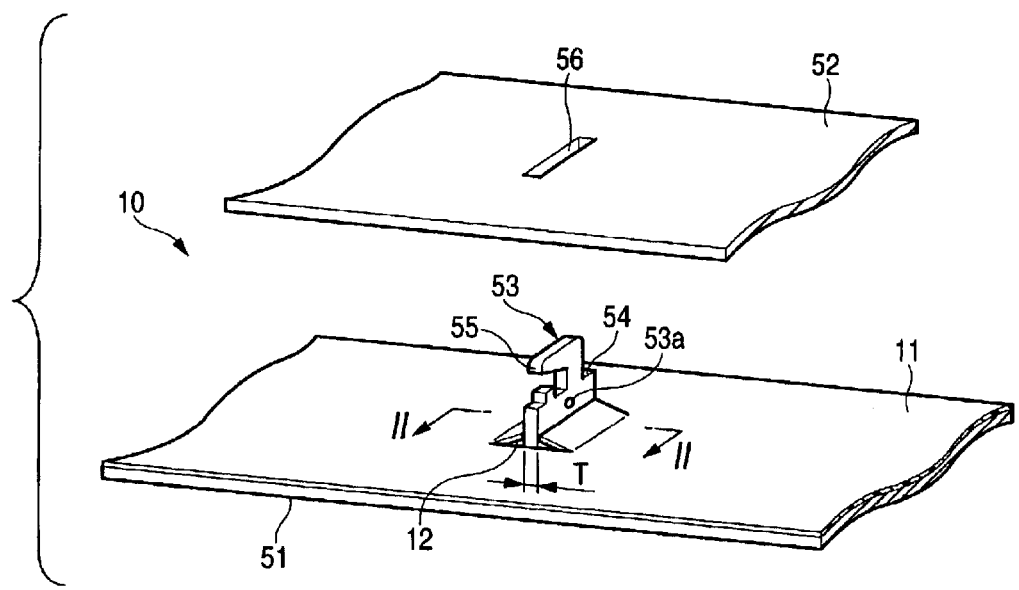
FIG. 1 is a perspective view showing an embodiment of a sheet according to the invention and an electronic apparatus using this sheet.

An embodiment of a sheet according to the invention and an electronic apparatus using the sheet will be described below in detail with reference to the accompanying drawings.

Incidentally, in the embodiment described below, description is simplified or omitted by marking the members described in FIGS. 11 to 15 already with the same signs or corresponding signs in the drawings.

Figure 2:
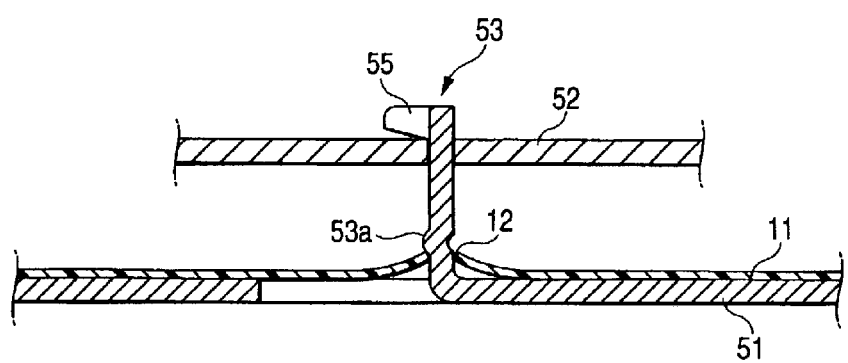
FIG. 2 is a sectional view in a position II—II in FIG. 1.

As shown in FIGS. 1 and 2, in an electronic apparatus 10 which is an embodiment according to the invention, an electric wiring substrate 52 is attached to a cut raised portion 53 acting as a coupling unit provided in a cabinet 51 of the electronic apparatus 10 acting as a base. The cut raised portion 53 is provided with a protrusion 53a protruding from its side. This protrusion 53a is formed by half die cutting or squeeze processing. Also, a sheet 11 according to the invention is provided between the cabinet 51 and the substrate 52.

The sheet 11 is made of insulating material such as paper, PET, resin or fiber, and a slit 12 is provided in a predetermined position.

Figure 3:
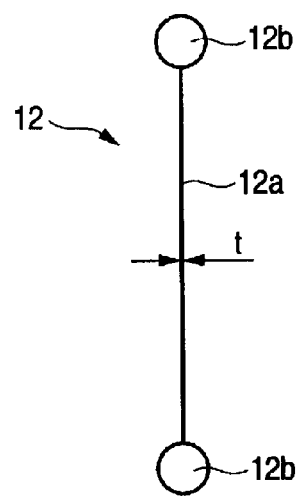
FIG. 3 is a plan view showing one example of a slit.

Various shapes are considered as the slit 12 and, for example, as shown in FIG. 3, a width t of a straight portion 12a of the slit 12 is smaller than a thickness T of the cut raised portion 53 and circular openings 12b without stress concentration portions are provided in both ends of the straight portion 12a of the slit 12 as a rupture stop portion.

Incidentally, a size of the opening 12b is not limited particularly and has only to be a size sufficiently large as compared with the width t of the slit 12.

Figure 4:
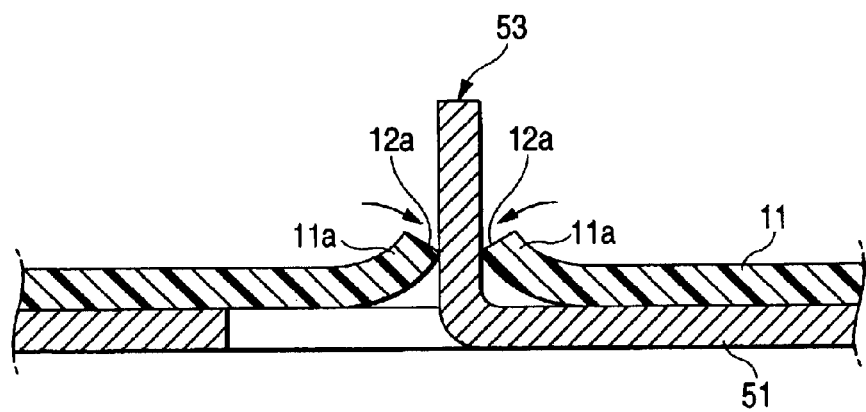
FIG. 4 is a sectional view showing a state in which the sheet is fixed with the sheet sandwiching a cut raised portion.

In the case of attaching such a sheet 11 to the cabinet 51, when the cut raised portion 53 is passed through the slit 12 so as to cover the sheet 11 from the upper side of the cabinet 51, the width t of the slit 12 is smaller than the thickness T of the cut raised portion 53, so that the sheet 11 of both sides of the slit 12 curls up along the cut raised portion 53 as shown in FIG. 4.

The sheets 11a curling up tend to return to the flat and thereby sandwich the cut raised portion 53 from both sides, so that the sheet 11 is fixed to the cut raised portion 53. In this case, the opening edge of the slit 12 is engaged to the protrusion 53a provided at the side of the cut raised portion 53, with the result that restoring force by the sheets 11a curling up is maintained and the sheet 11 can be fixed stably.

In this case, the cut raised portion 53 attempts to widen the slit 12, but the openings 12b for rupture prevention are provided in both ends of the slit 12, so that the slit 12 does not rupture. As a result of this, force by which the sheet 11 sandwiches the cut raised portion 53 does not loosen and the sheet 11 sandwiches the cut raised portion 53 surely, so that the sheet 11 is fixed.

According to the sheet 11 described above, the sheet 11 can be fixed to the cabinet 51 easily and surely without using adhesive such as tape or glue and also can be separated easily at the time of scrap since another material is not used.

Also, in the electronic apparatus 10 using the sheet 11 described above, the sheet 11 is fixed surely, so that the sheet 11 does not flutter even when the cabinet 51 vibrates.

Incidentally, the sheet 11 of the invention and the electronic apparatus 10 using the sheet 11 are not limited to the embodiment described above, and proper modifications and improvements can be made.

Figure 5:
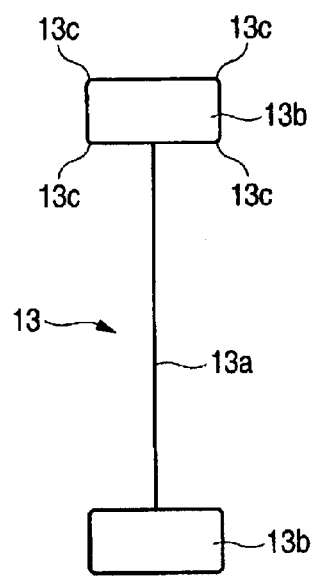
FIG. 5 is a plan view showing another example of a slit.

For example, in the embodiment described above, the case of providing the circular openings 12b in both ends of the slit 12 as the slit 12 as shown in FIG. 3 is described, but in addition, as shown in FIG. 5, it may be formed in a slit 13 in which rectangular openings 13b are provided in both ends of a straight portion 13a. In this case, it is desirable to round four corners 13c of the rectangular opening 13b and be formed so that stress does not concentrate in the four corners.

Figure 6:
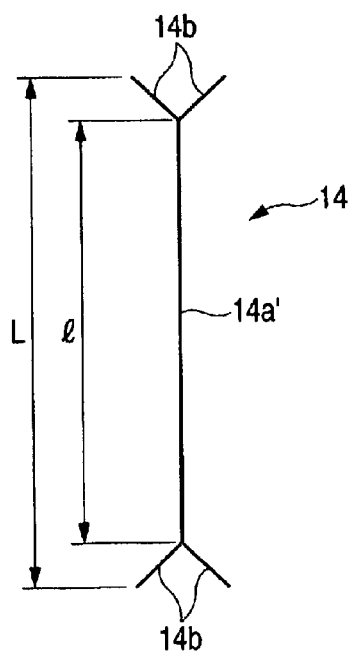
FIG. 6 is a plan view showing another example of a slit.

Also, as shown in FIG. 6, it may be constructed so as to provide Y-shaped rupture stop slits 14b inclined to a rupture direction in both ends of a straight portion 14a.

Figure 7A:
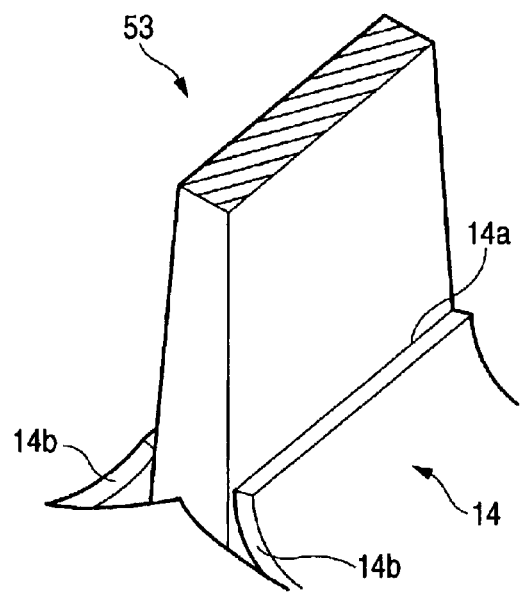
FIG. 7A is a perspective view showing a state of sandwiching two surfaces of the cut raised portion by the slit shown in FIG. 6

In this case, as shown in FIG. 7A, a length of the straight portion 14a of a slit 14 can be formed in the same length as a width W of the cut raised portion 53.

Figure 7B:
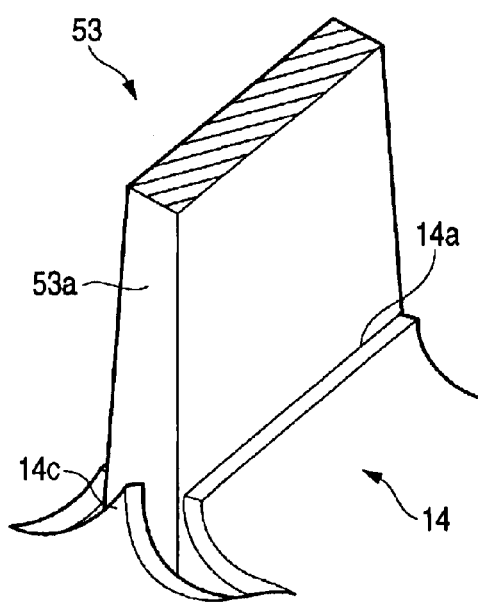
FIG. 7B is a perspective view showing a state of sandwiching four surfaces.

As shown in FIG. 7B, a length L including the rupture stop slits 14b of both ends can be formed in the same length as the width W of the cut raised portion 53.

In this case, the sheet 11 of portions 14c sandwiched between the rupture stop slits 14b holds both ends 53a of the cut raised portion 53, so that four surfaces of the cut raised portion 53 can be held and the sheet 11 can be fixed more tightly.

Figure 8:
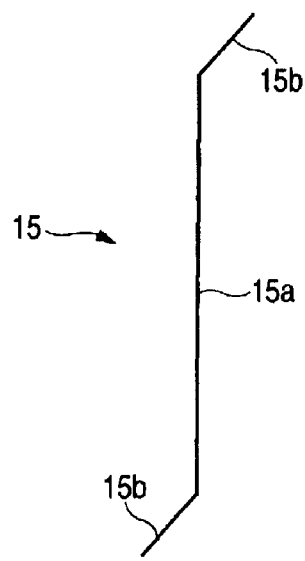
FIG. 8 is a plan view showing another example of a slit.

Also, as shown in FIG. 8, it may be constructed so that rupture stop slits 15b which are rupture stop portions provided in both ends of a straight portion 15a of a slit 15 are provided with only one inclined from the end of the straight portion 15a.

Figure 9:
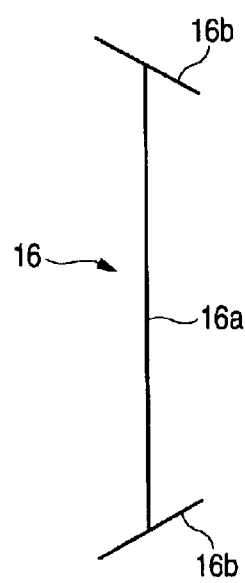
FIG. 9 is a plan view showing another example of a slit.

Also, as shown in FIG. 9, it may be constructed so that rupture stop slits 16b provided in both ends of a straight portion 16a of a slit 16 are inclined in opposite directions mutually.

Figure 10:
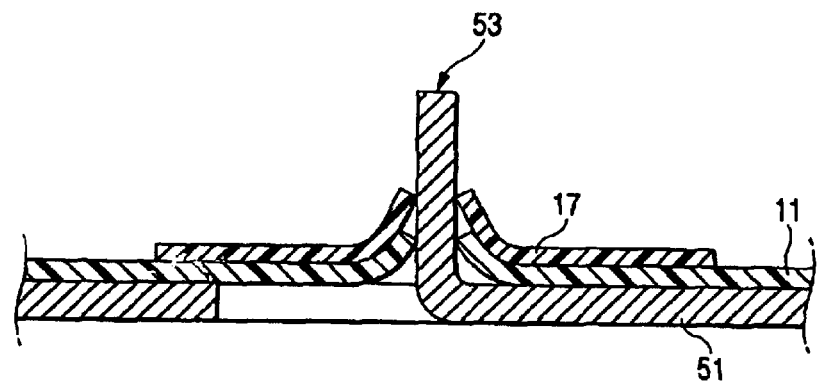
FIG. 10 is a sectional view showing a state of sandwiching the cut raised portion with a hold sheet overlaid on a slit portion.
Figure 11:
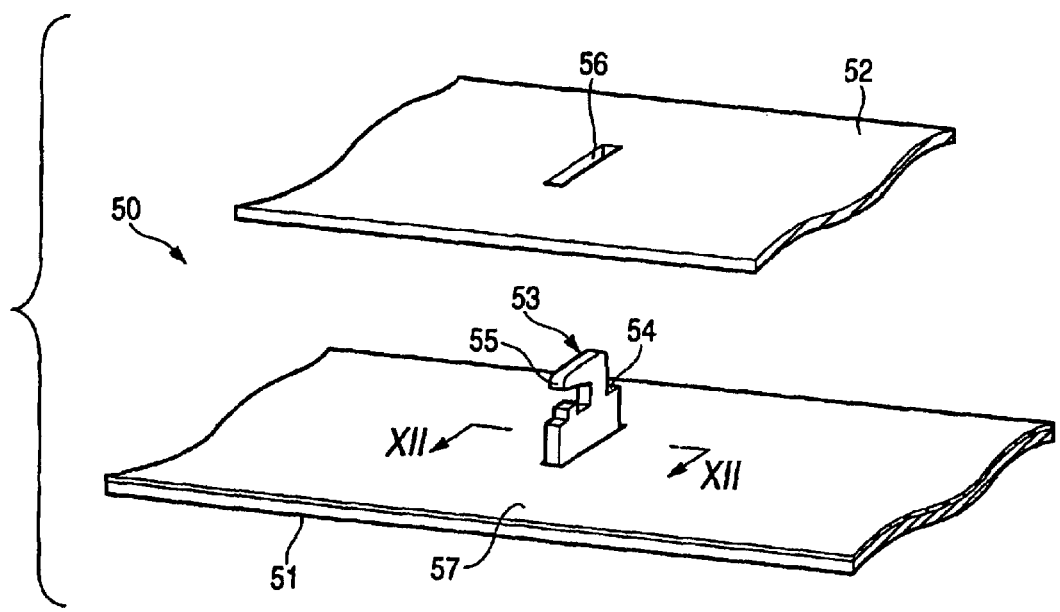
FIG. 11 is a perspective view showing of a conventional sheet and an electronic apparatus using this sheet.
Figure 12:
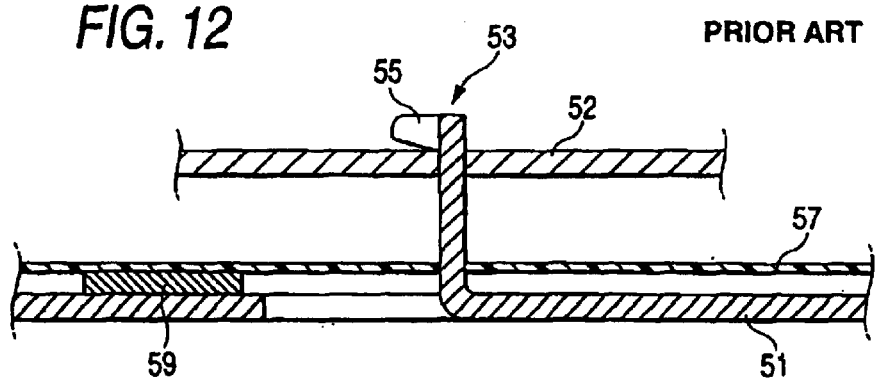
FIG. 12 is a sectional view in apposition X II—X II in FIG. 11.
Figure 13:
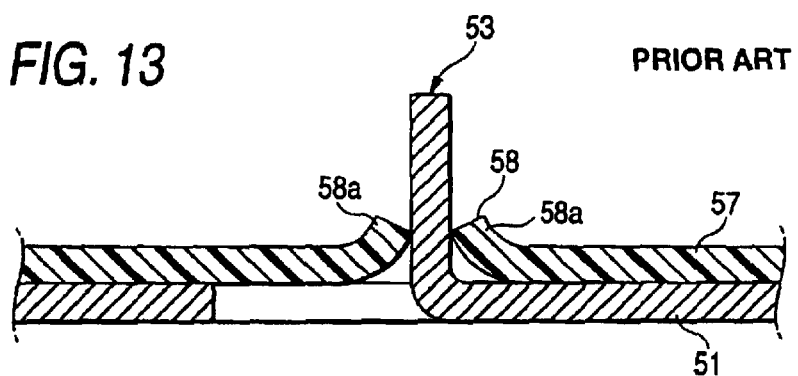
FIG. 13 is a sectional view showing a state in which the sheet is fixed with the sheet sandwiching a cut raised portion.
Figure 14:
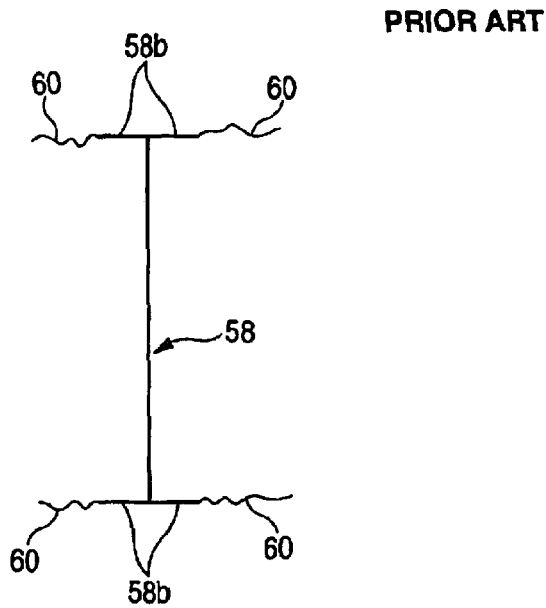
FIG. 14 is an explanatory diagram of rupture occurring in the ends of a slit.
Figure 15A:
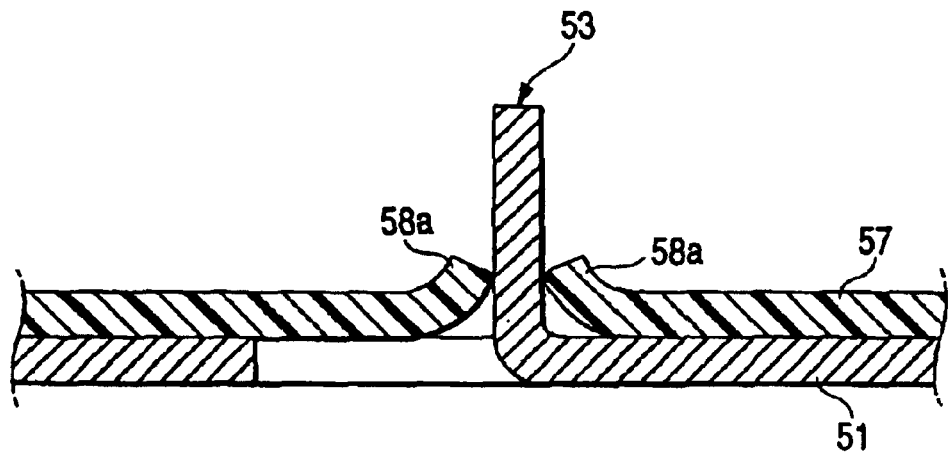
FIG. 15A is a sectional view showing a state in which the conventional sheet is fixed with the sheet sandwiching the cut raised portion and FIG. 15B is a sectional view showing a problem after the rupture.
Figure 15B:
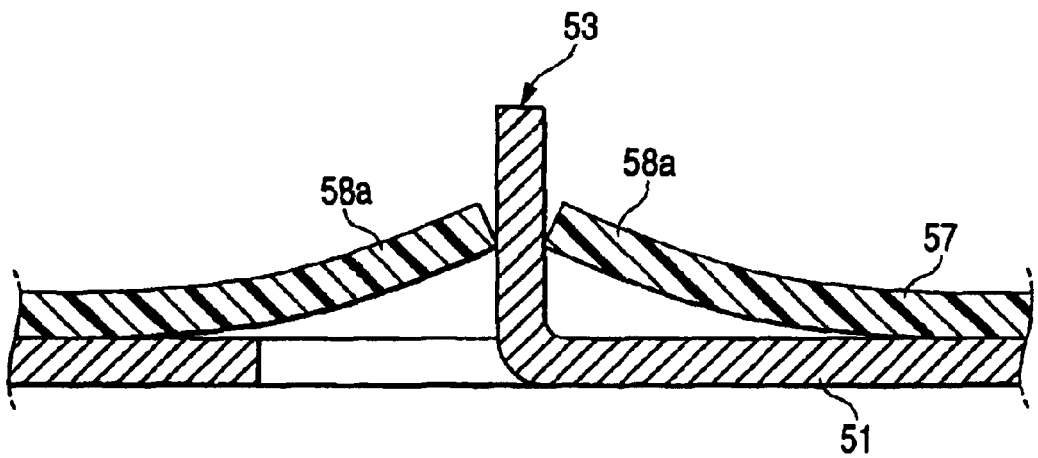

Also, as shown in FIG. 10, a hold sheet 17 with a size including the slit 12 and the vicinity of this slit 12 and the same material as that of the sheet 11 can be used with the hold sheet 17 overlaid on the sheet 11. In this case, force sandwiching the cut raised portion 53 increases, so that the sheet 11 can be fixed more surely.

As described above, in accordance with a sheet according to the invention and an electronic apparatus using this sheet, a coupling unit for attaching an electric wiring substrate to a cabinet of the electronic apparatus is passed through a slit provided in the sheet and thereby, the sheet can be fixed to a base easily and surely.

In this case, force by which the slit is caused to be ruptured further by the coupling unit acts, but rupture can be prevented by rupture stop portions provided in both ends of the slit. Also, adhesive means such as tape or glue is not used for fixing the sheet, so that cost cutting can be achieved and also there is no need for separation at the time of scrap and recycling can be performed easily.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An insulating sheet composition which is attached to a coupling unit raised from a base and is placed on the base, comprising:
    a sheet having a slit through which the coupling unit passes wherein a width of the slit is formed smaller than a thickness of the coupling unit, and rupture stops formed at both ends of the slit; and
    a hold sheet of similar material as that of the sheet and having a slit, wherein the hold sheet is disposed on top of and adjacent to said sheet such that the coupling unit passes through the slits of both the sheet and the hold sheet.

2. The sheet as defined in claim 1, wherein the rupture stop is an opening formed in a shape without a stress concentration portion or a rupture stop slit inclined to a rupture direction acting on the slit end.

3. An electronic apparatus which has a base and attaches an electric wiring substrate by a coupling unit raised from this base and provides a sheet placed between the base and the electric wiring substrate, wherein the sheet has a slit in which a width is formed smaller than a thickness of the coupling unit and rupture stops are formed in both ends, and the slit is passed through the coupling unit so as to be raised from the base, and
    wherein a protrusion capable of engaging the raised slit is provided at the side of the coupling unit.

* * * * *